United States Patent
Lin et al.

(10) Patent No.: US 9,462,685 B2
(45) Date of Patent: Oct. 4, 2016

(54) METHOD FOR PENETRATING A FLEXIBLE CIRCUIT BOARD

(71) Applicant: ADVANCED FLEXIBLE CIRCUITS CO., LTD., Taoyuan County (TW)

(72) Inventors: Gwun-Jin Lin, Taoyuan County (TW); Kuo-Fu Su, Taoyuan County (TW); Chih-Heng Chuo, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 247 days.

(21) Appl. No.: 14/090,157

(22) Filed: Nov. 26, 2013

(65) Prior Publication Data

US 2015/0017818 A1 Jan. 15, 2015

(30) Foreign Application Priority Data

Jul. 12, 2013 (TW) .............................. 102125021 A

(51) Int. Cl.
*H05K 1/02* (2006.01)
*B29C 53/04* (2006.01)

(52) U.S. Cl.
CPC ............... *H05K 1/028* (2013.01); *B29C 53/04* (2013.01); *H05K 2201/051* (2013.01); *H05K 2201/056* (2013.01); *H05K 2201/057* (2013.01); *H05K 2201/09063* (2013.01); *H05K 2203/0195* (2013.01); *Y10T 29/49826* (2015.01)

(58) Field of Classification Search
CPC ........ H05K 1/028; H05K 1/14; H05K 1/148; H05K 3/361; H05K 3/368; H05K 2201/051; H05K 2201/056; H05K 2201/057; H05K 2201/09063; H05K 2203/0195; B29C 53/04; Y10T 29/49826
See application file for complete search history.

(56) References Cited

U.S. PATENT DOCUMENTS

| | | | | |
|---|---|---|---|---|
| 7,907,415 B2* | 3/2011 | Ueyama | ................ | G06F 1/1681 361/749 |
| 2006/0238970 A1* | 10/2006 | Ukonaho | .............. | G06F 1/1681 361/679.01 |
| 2008/0307608 A1* | 12/2008 | Goto | ..................... | G06F 1/1618 16/366 |
| 2009/0000062 A1* | 1/2009 | Yamanami | ............ | G06F 1/1616 16/366 |
| 2009/0013500 A1* | 1/2009 | Ueyama | ................ | G06F 1/1616 16/354 |

* cited by examiner

Primary Examiner — Carl Arbes
(74) Attorney, Agent, or Firm — Rosenberg, Klein & Lee

(57) ABSTRACT

Disclosed are a method and a structure of penetration and combination for a flexible circuit board with a hinge assembly. A pre-formed flexible circuit board is processed by taking a pre-folding line as a center line to fold a connection section of the flexible circuit board toward the terminal distribution section. Then, the connection section is rolled in a direction toward the terminal distribution section so as to make the connection section forming a rolled body. The rolled body is then put through the bore of the hinge assembly to have the rolled body completely extend through the bore of the hinge assembly so that the extension section of the flexible circuit board is positioned in the bore of the hinge assembly and the first end and the second end are respectively located at opposite sides of the bore of the hinge assembly.

9 Claims, 10 Drawing Sheets

METHOD FOR PENETRATING A FLEXIBLE CIRCUIT BOARD

BACKGROUND OF THE INVENTION

1. Field of the Invention

The present invention relates to a method and a structure for combining a flexible circuit board and a hinge assembly, and in particular to a method and a structure for realizing penetration and combination of a flexible circuit board with a hinge assembly.

2. The Related Arts

A lot of electronic devices or communication devices that are currently available in the market use hinge structures. For example, in the structure designs of the currently prevailing mobile phones, a cover or a screen is often coupled to a phone body with a hinge structure. To allow electronic signals to be transmitted to the cover or screen, a currently adopted solution is using a miniaturized flexible cable product or extremely thin conductors that are bundled together to serve as a transmission line for signals.

Although the solution of using miniaturized cable or bundled thin conductors to serve as a transmission line of signals may suit the needs for transmission of signals, yet the size of the hinge structure is constrained from further downsizing. This poses a significant constraint to the structure design of the entire mobile phone. Further, in the applications of the contemporary mobile phone designs or notebook computers, signals that need to be transmitted through the hinge structure are getting more and more and the size of the hinge structure is required to be increasingly smaller, accompanied with the substitute of one-dimensional structures of hinge with two-dimensional structures, the conventional designs of flat cable no longer suit the needs.

Under such a condition, if the conventional designs of flat cable are still adopted, even through the flat cable itself is capable of penetrating through a bore of the hinge structure, in the operation of an electronic device including the hinge structure, the operation of the hinge structure is often affected by the flat cable. Further, the flat cable is also undesirably driven by a rotation operation initiated by a user to have individual wires of the flat cable entangling with each other and twisted. Such a situation, if getting severe, may cause damage to some of the wires of the flat cable.

Although some manufacturers makes the bore of the hinge structure a C-shaped holes to overcome the need for penetration and combination of a flexible circuit board and a hinge structure, this complicates the structure of the bore of the hinge structure.

SUMMARY OF THE INVENTION

In light of the above described desire for a flexible circuit board to penetrate through a bore of a hinge structure, the primary object of the present invention is to provide a method for realizing penetration and combination of a signal transmission flat cable with a hinge structure and a combining structure thereof, so as to provide a method and a combining structure that are suitable for applications where a miniature hinge components are included or transmission of a large number of signals is desired.

The technical solution that the present invention adopts to handle the problems of the prior art devices is to process a pre-formed flexible circuit board by folding a connection section of the flexible circuit board toward the terminal distribution section with a pre-folding line serving as a center line. Then, the connection section is rolled in a direction toward the terminal distribution section so as to make the connection section forming a rolled body. The rolled body is then put through the bore of the hinge assembly to have the rolled body completely extend through the bore of the hinge assembly so that the extension section of the flexible circuit board is positioned in the bore of the hinge assembly and the first end and the second end are respectively located at opposite sides of the bore of the hinge assembly.

With the structural design and method according to the present invention, a flexible circuit board that was originally planar and was incapable of penetrating through a bore of a hinge structure due to being excessively wide is rolled to form a rolled body that has a volume less than the opening of the bore of the hinge assembly and is thus extendable therethrough.

The structure of the present invention, when used in combination with a cluster structure of a flexible circuit board, is applicable to numerous electronic devices that include one-dimensional or two-dimensional hinge structures. For example, in the application of the signal transmission line of the present invention to a mobile phone having a hinge structure, when a screen of the mobile phone is rotated with respect to a main body of the mobile phone in a front-rear rotation direction or a horizontal rotation direction, a plurality of cluster lines of a cluster section of the signal transmission line according to the present invention is allowed to deflect and bend independently so that the cluster lines do not entangle with each other and twist and the signal transmission line will not be damaged by the front-rear rotation and the operation of the hinge structure is not affected.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
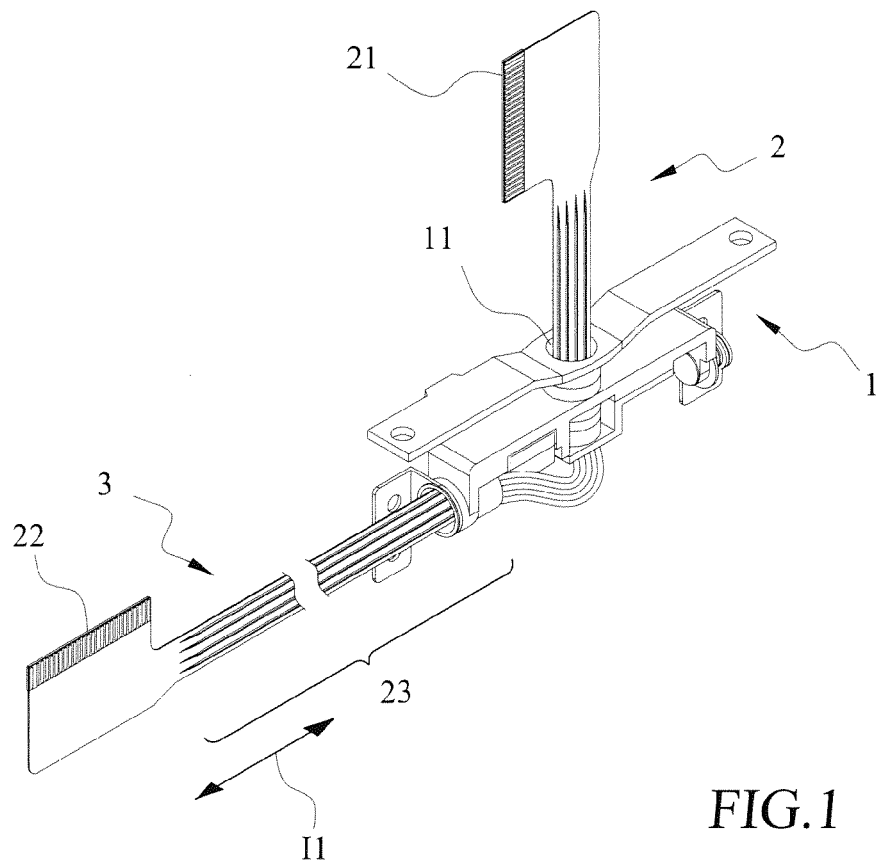
FIG. 1 is a perspective view showing a penetration and combination structure of a flexible circuit board and a hinge assembly according to a first embodiment of the present invention.
Figure 2:
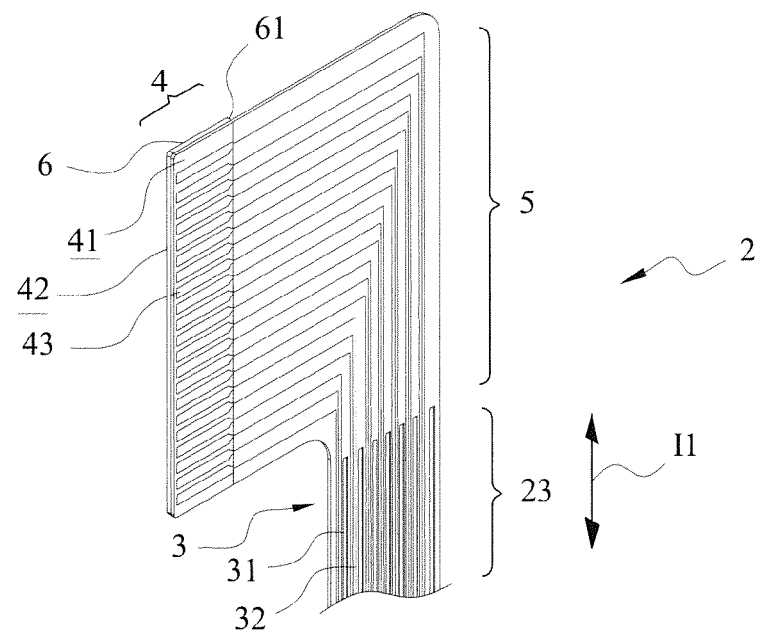
FIGS. 2-8 are perspective views showing sequentially the steps of an operation of using the first embodiment of the present invention.

With reference to the drawings and in particular to FIGS. 1 and 2, a method for penetration and combination of a flexible circuit board and a hinge assembly according to a first embodiment of present invention is provided for realizing penetration and combination of a flexible circuit board 2 with a bore 11 of a hinge assembly 1.

The flexible circuit board 2 comprises a first end 21, a second end 22, and an extension section 23 extending in an extension direction I1 between the first end 21 and the second end 22. The flexible circuit board 2 is made of a soft material in order to provide the flexible circuit board 2 with the property of flexibility.

The extension section 23 comprises a cluster structure 3. The cluster structure 3 is made up of a plurality of cluster lines 32 that is formed by applying a plurality of cutting lines 31 to cut the flexible circuit board 2 in the extension direction I1. The first end 21 of the flexible circuit board 2 comprises a terminal distribution section 4 and a connection section 5, wherein the terminal distribution section 4 has a first surface 41 and a second surface 42 and the connection section 5 is connected between the terminal distribution section 4 and the extension section 23.

In the present invention, the first surface 41 and the second surface 42 of the terminal distribution section 4 of the flexible circuit board 2 are provided with a plurality of conductive terminals 43 that is spaced and isolated from each other. The second surface 42 of the terminal distribution section 4 is provided with a reinforcement board 6 attached thereto to reinforce the terminal distribution section 4. The reinforcement board 6 has a side edge that defines a pre-folding line 61.

After a combination operation of the flexible circuit board 2 and the hinge assembly 1 is completed by applying the method of penetration and combination of a flexible circuit board and a hinge assembly according to the present invention, the extension section 23 of the flexible circuit board 2 is received in the bore 11 of the hinge assembly 1 so that the first end 21 and the second end 22 of the flexible circuit board 2 are respectively located at two opposite sides of the bore 11 of the hinge assembly 1.

Figure 3:
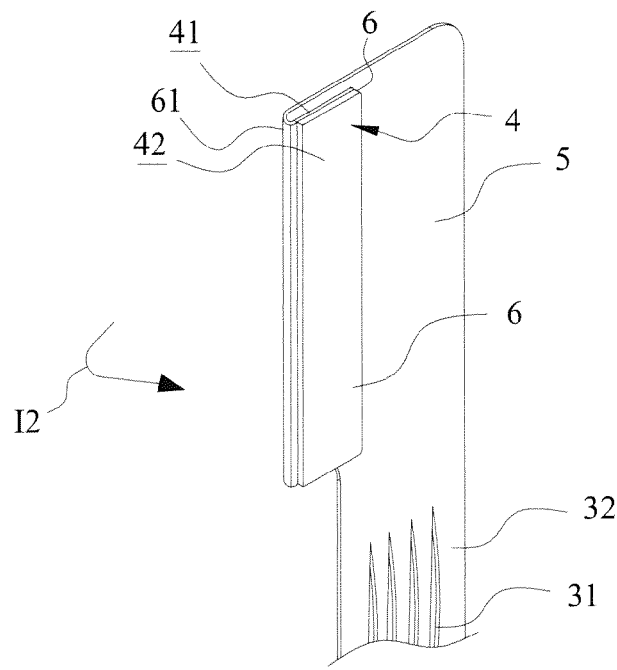

Referring to FIGS. 2-8, steps of the method of penetration and combination of a flexible circuit board and a hinge assembly according to the present invention are sequentially shown. First of all, folding is made in a folding direction I2 toward the first surface 41 of the terminal distribution section 4 by taking the pre-folding line 61 that is defined between the terminal distribution section 4 and the connection section 5 of the first end 21 of the flexible circuit board 2 as a center line (as illustrated in FIG. 3), so as to make the first surface 41 of the terminal distribution section 4 adjacent to the connection section 5.

Figure 4:
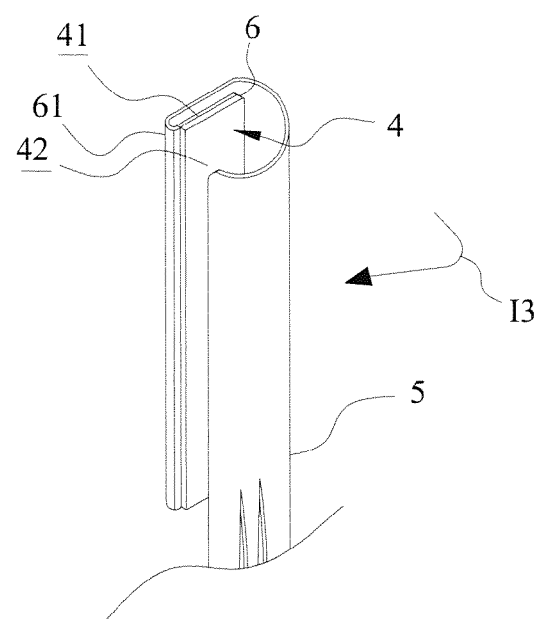
Figure 5:
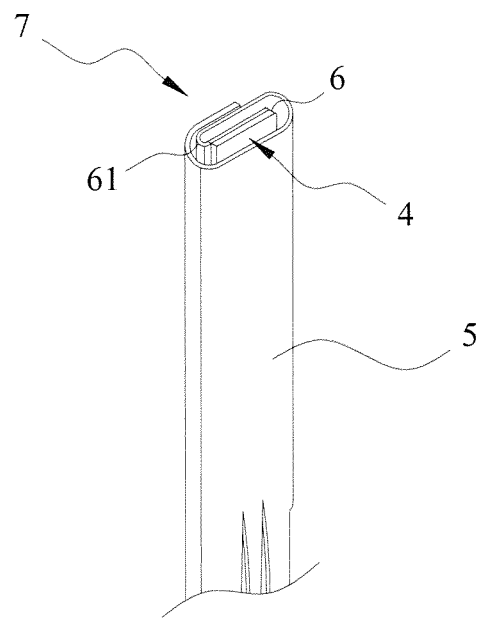

Next, the connection section 5 is rolled in a rolling direction I3 toward the terminal distribution section 4 (as shown in FIG. 4) so as to make the connection section 5 forming a rolled body 7 (as shown in FIG. 5). In the embodiment, when the connection section 5 is rolled in a direction toward the terminal distribution section 4, the connection section 5 is wrapped to cover the second surface 42 of the terminal distribution section 4.

Figure 6:
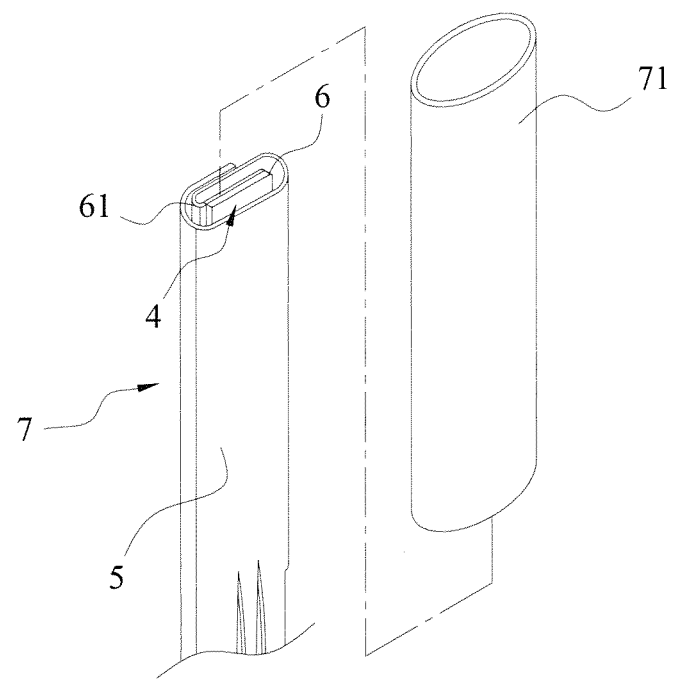
Figure 7:
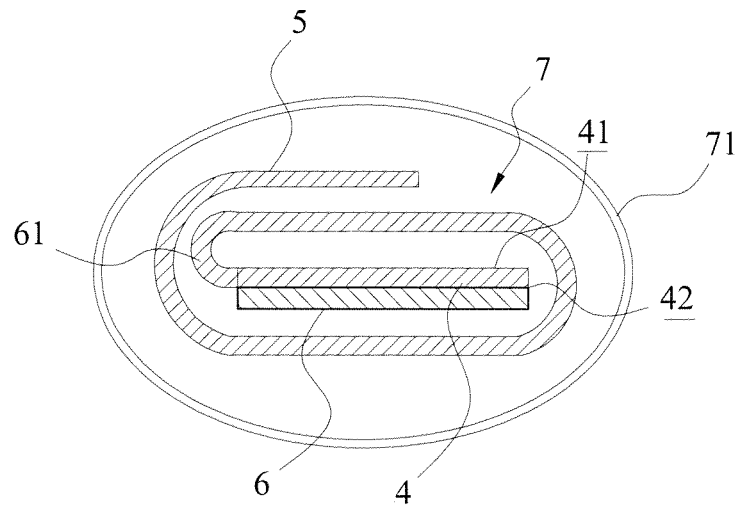
Figure 8:
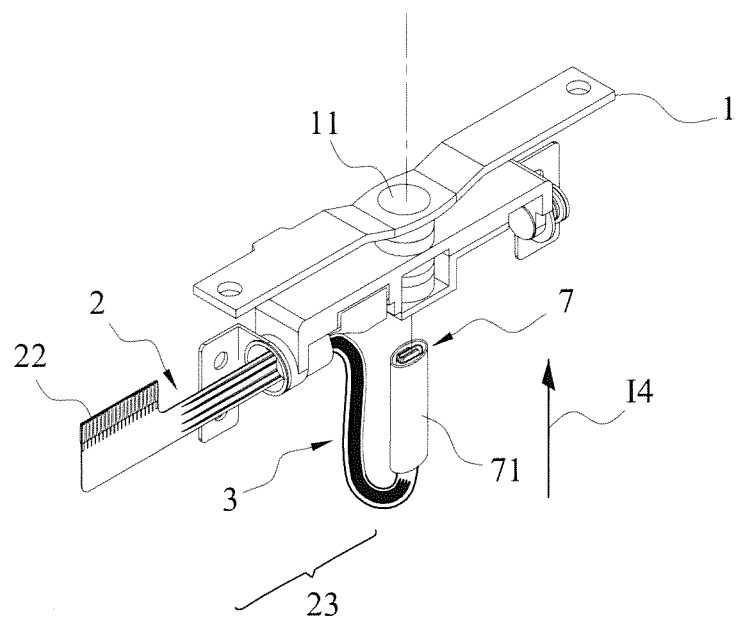
Figure 9:
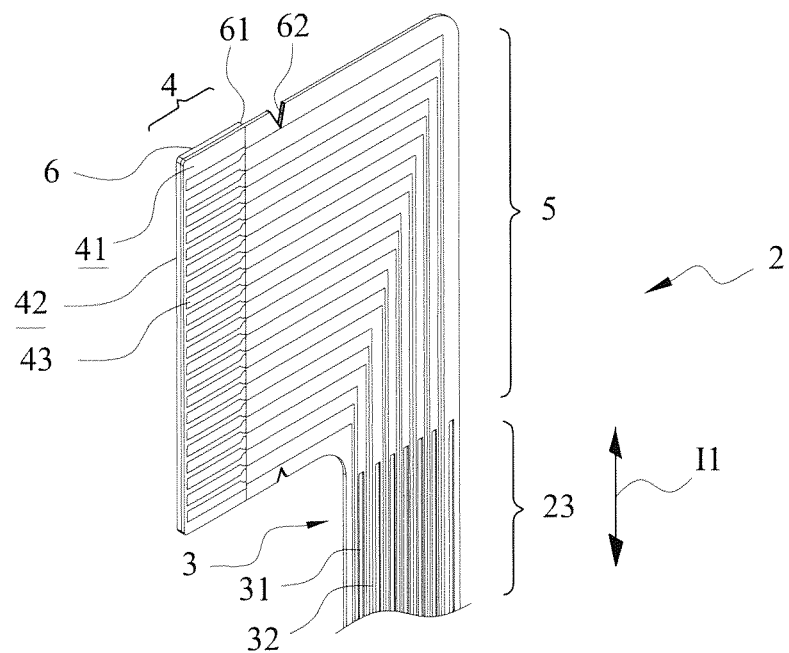
FIG. 9 illustrates a notch formed in a flexible circuit board between a terminal distribution section and a connection section to serve as an alternative pre-folding line for the first embodiment of the present invention.

Afterwards, the present invention applies a protection sleeve 71 to sleeve over and enclose the rolled body 7 (as shown in FIGS. 6 and 7). The rolled body 7 that is enclosed by the protection sleeve 71 is put in a penetration direction I4 through the bore 11 of the hinge assembly 1 (as shown in FIG. 8) to have the rolled body 7 completely extending through the bore 11 of the hinge assembly 1. As such, as shown in FIG. 1, the extension section 23 of the flexible circuit board 2 is positioned in the bore 11 of the hinge assembly 1 and the first end 21 and the second end 22 are respectively located at two opposite sides of the bore 11 of the hinge assembly 1.

After the rolled body 7 is set through the bore 11 of the hinge assembly 1, the rolled body 7 is unrolled to make the connection section 5 and the terminal distribution section 4 planar again. The first end and the second end of the flexible circuit board may then be respectively inserted to or coupled with insertion receptacles or other components.

In the previous illustration, the pre-folding line 61 is formed by using a side edge of the reinforcement board 6 of the terminal distribution section 4 to serve as the pre-folding line. Alternatively, a notch 62 formed inn the flexible circuit board 2 between the terminal distribution section 4 and the connection section 5 can be used as the pre-folding line.

Referring to FIGS. 10-15, a method of penetration and combination of a flexible circuit board and a hinge assembly according to a second embodiment of the present invention is illustrated, which comprises steps that are substantially identical to those of the embodiment described previously so that identical components are designated with the same references for consistency.

Figure 10:
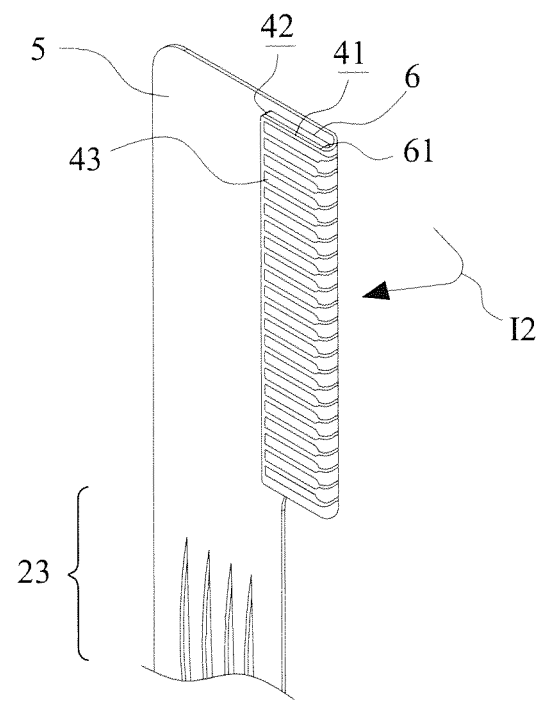
FIGS. 10-15 are perspective views showing sequentially the steps of an operation according to a second embodiment of the present invention.

First of all, folding is made in a folding direction I2 toward the first surface 41 of the terminal distribution section 4 by taking the pre-folding line 61 that is defined between the terminal distribution section 4 and the connection section 5 of the first end 21 of the flexible circuit board 2 as a center line (as illustrated in FIG. 10), so as to make the second surface 42 of the terminal distribution section 4 adjacent to the connection section 5.

Figure 11:
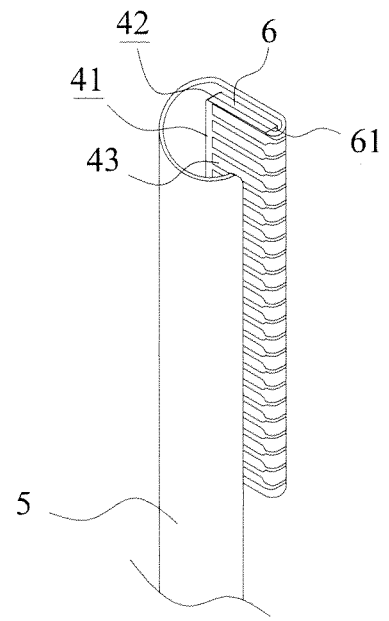
Figure 12:
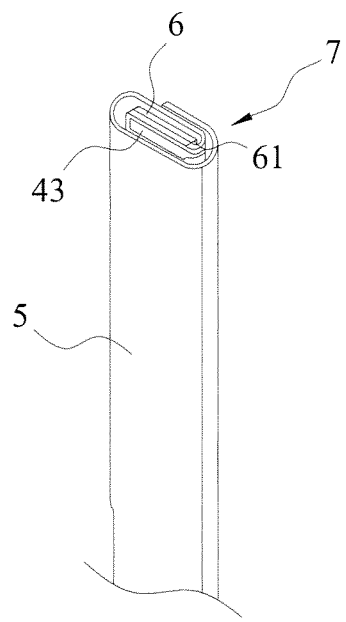

Next, the connection section 5 is rolled in a rolling direction I3 toward the terminal distribution section 4 (as shown in FIG. 11) so as to make the connection section 5 forming a rolled body 7 (as shown in FIG. 12).

Figure 13:
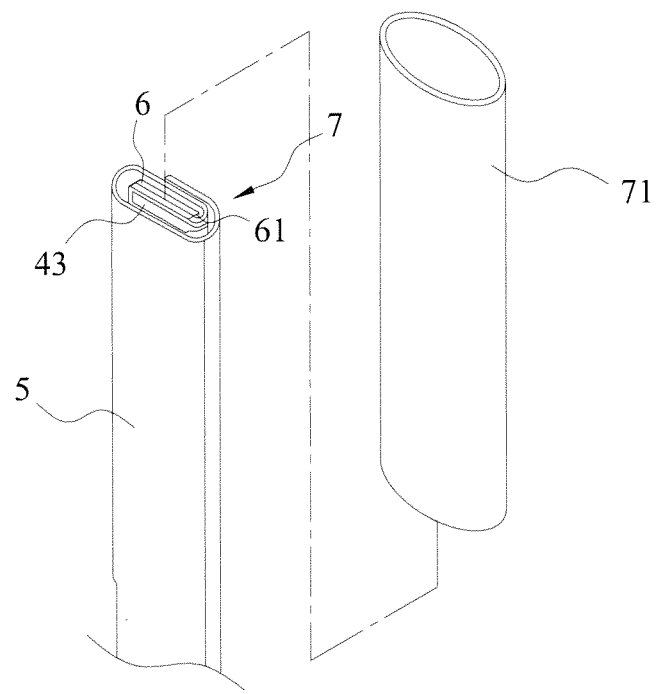
Figure 14:
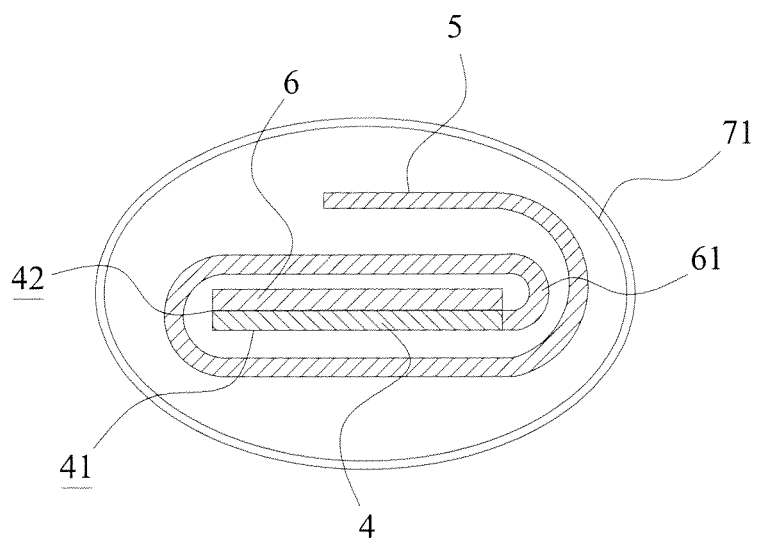
Figure 15:
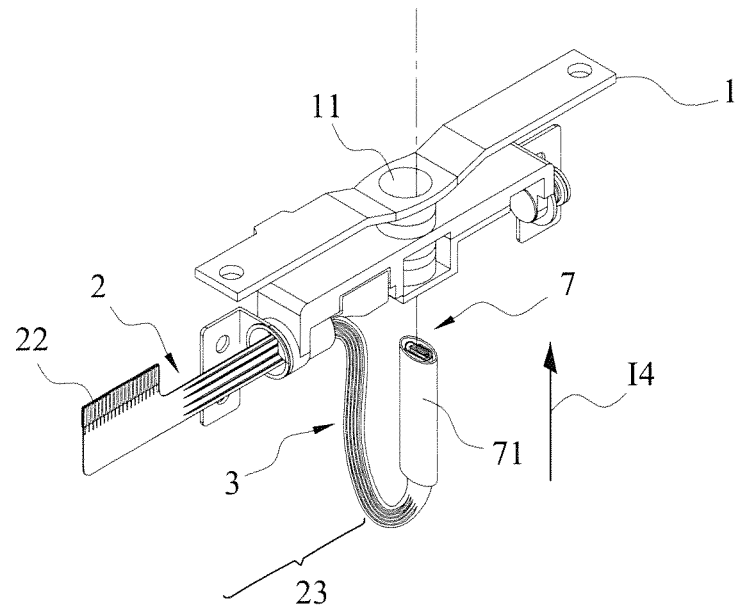

Afterwards, the present invention applies a protection sleeve 71 to sleeve over and enclose the rolled body 7 (as shown in FIGS. 13 and 14). The rolled body 7 that is enclosed by the protection sleeve 71 is put in a penetration direction I4 through the bore 11 of the hinge assembly 1 (as shown in FIG. 15) to have the rolled body 7 completely extending through the bore 11 of the hinge assembly 1.

After the rolled body 7 is set through the bore 11 of the hinge assembly 1, the rolled body 7 is unrolled to make the connection section 5 and the terminal distribution section 4 planar again. The first end and the second end of the flexible circuit board may then be respectively inserted to or coupled with insertion receptacles or other components.

Referring to FIGS. 16-20, a method of penetration and combination of a flexible circuit board and a hinge assembly according to a third embodiment of the present invention is illustrated, which comprises steps that are substantially identical to those of the embodiments described previously so that identical components are designated with the same references for consistency.

Figure 16:
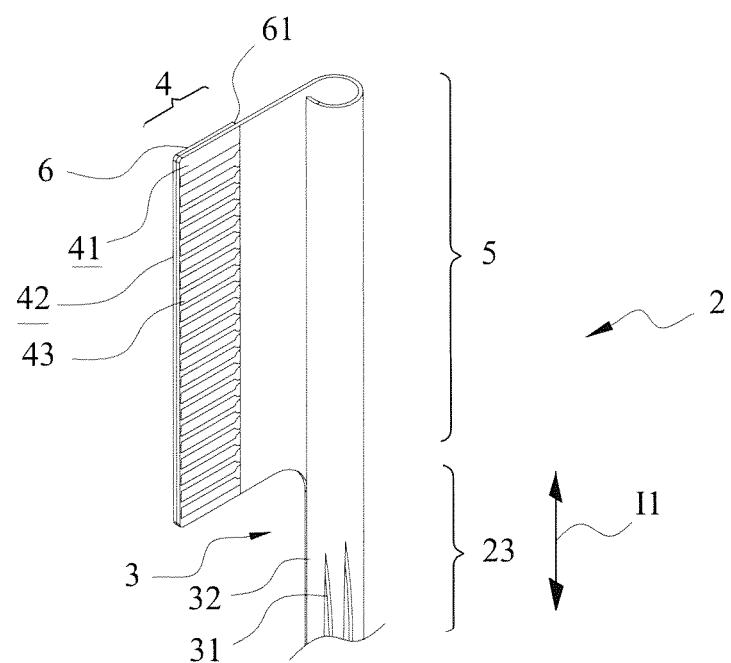
FIGS. 16-20 are perspective views showing sequentially the steps of an operation according to a second embodiment of the present invention.
Figure 17:
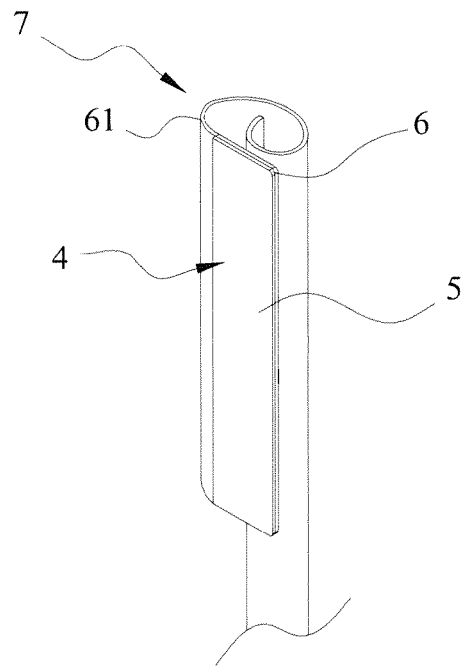

First of all, the connection section 5 of the flexible circuit board 2 is rolled in a rolling direction I3 toward the first surface 41 of the terminal distribution section 4 (as shown in FIG. 16) so as to make the connection section 5 forming a rolled body 7 (as shown in FIG. 17).

Figure 18:
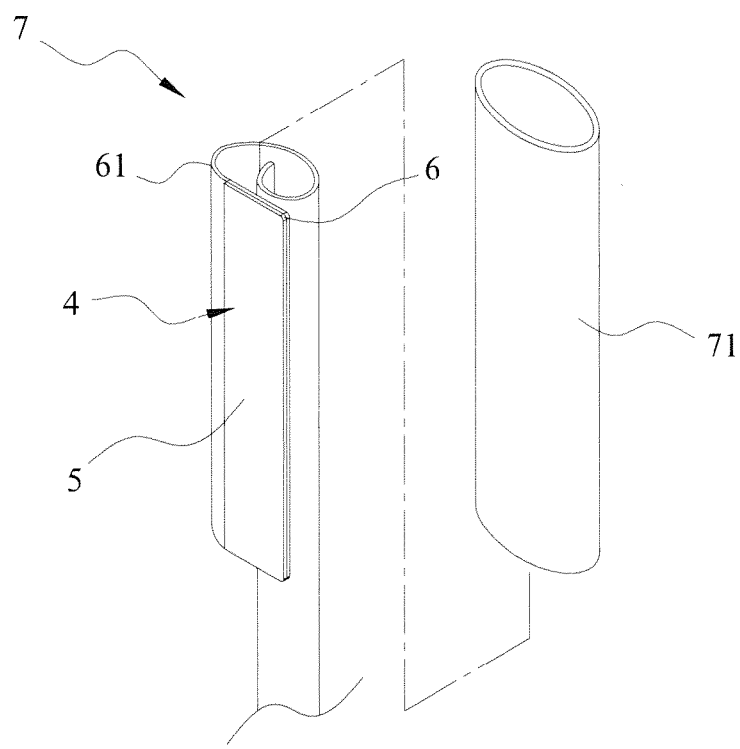
Figure 19:
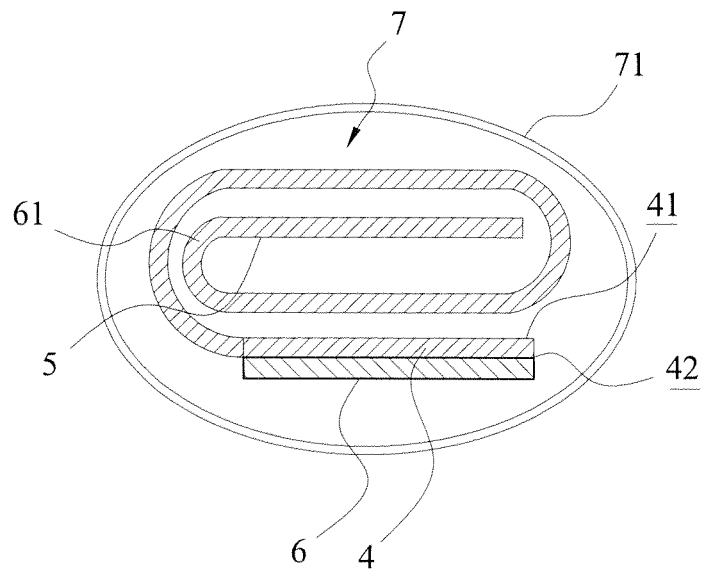
Figure 20:
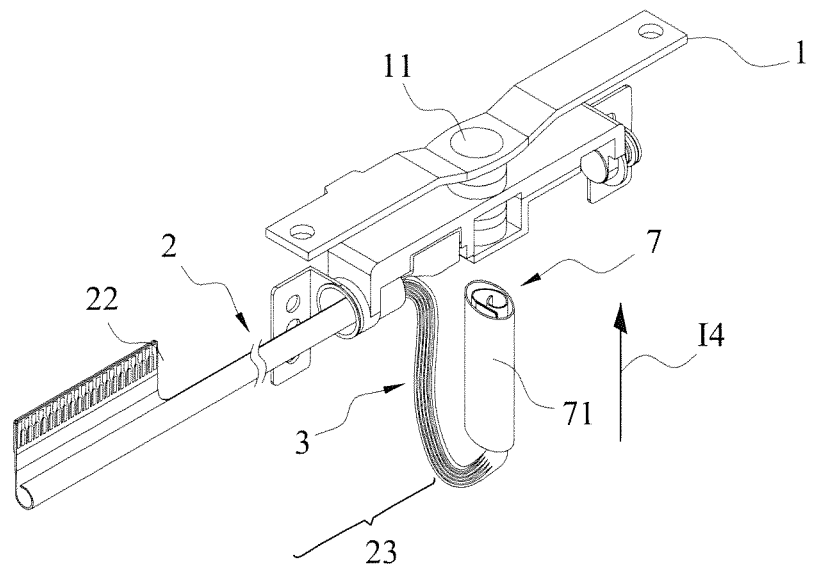

Afterwards, the present invention applies a protection sleeve 71 to sleeve over and enclose the rolled body 7 (as shown in FIGS. 18 and 19). The rolled body 7 that is enclosed by the protection sleeve 71 is put in a penetration direction I4 through the bore 11 of the hinge assembly 1 (as shown in FIG. 20) to have the rolled body 7 completely extending through the bore 11 of the hinge assembly 1.

After the rolled body 7 is set through the bore 11 of the hinge assembly 1, the rolled body 7 is unrolled to make the connection section 5 and the terminal distribution section 4 planar again. The first end and the second end of the flexible circuit board may then be respectively inserted to or coupled with insertion receptacles or other components.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for penetrating a flexible circuit board through a bore of a hinge assembly, the flexible circuit board comprising a first end, a second end, and an extension section extending in an extension direction between the first end and the second end, the extension section comprising a cluster structure, the cluster structure comprising a plurality of cluster lines formed by applying a plurality of cutting lines to cut the flexible circuit board in the extension direction, the first end of the flexible circuit board comprising a terminal distribution section and a connection section, wherein the terminal distribution section has a first surface and a second surface and the connection section is connected between the terminal distribution section and the extension section, the method comprising the following steps:
   (a) forming a pre-folding line between the terminal distribution section and the connection section of the first end of the flexible circuit board, said pre-folding line being parallel to a long dimension of the connection section and a long dimension of the terminal distribution section;
   (b) with the pre-folding line as a center line, folding the connection section toward the first surface of the terminal distribution section to make the connection section adjacent to the terminal distribution section, wherein the long dimension of the connection section remains parallel to the long dimension of the terminal distribution section after said folding;
   (c) rolling the connection section in a direction toward the terminal distribution section so as to make the resulting combination of the connection section and the terminal distribution section form a rolled body, in which the resulting combination forms a quasi-elliptical cylinder shape; and
   (d) putting the rolled body through the bore of the hinge assembly to have the rolled body completely extending through the bore of the hinge assembly, whereby the extension section of the flexible circuit board is positioned in the bore of the hinge assembly and the first end and the second end are respectively located at opposite sides of the bore of the hinge assembly.

2. The method as claimed in claim 1 further comprising, after step (c), a step of enclosing the rolled body with a protection sleeve.

3. The method as claimed in claim 1, wherein in step (c), when the connection section is rolled in a direction toward the terminal distribution section, the connection section is wrapped to cover the second surface of the terminal distribution section.

4. The method as claimed in claim 1, wherein in step (c), when the connection section is rolled in a direction toward the terminal distribution section, the connection section is wrapped to cover the first surface of the terminal distribution section.

5. The method as claimed in claim 1 further comprising, after step (d), a step of unrolling the rolled body to make the connection section and the terminal distribution section planar.

6. The method as claimed in claim 1, wherein the first surface of the flexible circuit board comprises a plurality of conductive terminals spaced and isolated from each other.

7. The method as claimed in claim 1, wherein the second surface of the flexible circuit board comprises a plurality of conductive terminals spaced and isolated from each other.

8. The method as claimed in claim 1, wherein one of the first surface and the second surface of the terminal distribution section comprises a reinforcement board attached thereto, the reinforcement board having a side edge that serves as the pre-folding line.

9. The method as claimed in claim 1, wherein the flexible circuit board comprises a notch formed therein between the terminal distribution section and the connection section to serve as the pre-folding line.

* * * * *